United States Patent
Cheah et al.

(10) Patent No.: US 9,608,679 B2
(45) Date of Patent: Mar. 28, 2017

(54) VERY LOW INTERMEDIATE FREQUENCY (VLIF) RECEIVER AND A METHOD OF CONTROLLING A VLIF RECEIVER

(71) Applicant: MOTOROLA SOLUTIONS, INC, Schaumburg, IL (US)

(72) Inventors: Chow Loong Cheah, Ipoh (MY); Kim Loy Lai, Wilayah Persekutuan (MY); Kar Boon Oung, Penang (MY); Moh Lim Sim, Pulau Pinang (MY); V. C. Prakash V K Chacko, Penang (MY)

(73) Assignee: MOTOROLA SOLUTIONS, INC., Chicago, IL (US)

( * ) Notice: Subject to any disclaimer, the term of this patent is extended or adjusted under 35 U.S.C. 154(b) by 0 days.

(21) Appl. No.: 14/440,297

(22) PCT Filed: Nov. 7, 2012

(86) PCT No.: PCT/IB2012/002589
§ 371 (c)(1),
(2) Date: May 1, 2015

(87) PCT Pub. No.: WO2014/072761
PCT Pub. Date: May 15, 2014

(65) Prior Publication Data
US 2015/0295604 A1 Oct. 15, 2015

(51) Int. Cl.
H04B 1/10 (2006.01)
H03D 7/18 (2006.01)
H03D 3/00 (2006.01)

(52) U.S. Cl.
CPC ............ H04B 1/1027 (2013.01); H03D 3/002 (2013.01); H03D 7/18 (2013.01); H04B 1/109 (2013.01); H03D 2200/0088 (2013.01)

(58) Field of Classification Search
CPC ........... H04B 1/123; H04B 1/001; H04B 1/10; H04B 2001/305; H04B 1/1027; H04B 1/109; H03D 2200/0082; H03D 2200/0088; H03D 3/002; H03D 7/166; H03D 7/18; H04L 27/3863
See application file for complete search history.

(56) References Cited

U.S. PATENT DOCUMENTS 6,349,120 B1 * 2/2002 Shi .................. H04L 27/2655
375/316
6,707,858 B1 3/2004 Davie
(Continued)

FOREIGN PATENT DOCUMENTS

| WO | 2005/065310 A3 | 9/2006 |
| WO | 2008089840 A1 | 7/2008 |
| WO | 2010/002740 A1 | 1/2010 |

OTHER PUBLICATIONS

Corresponding International Application No. PCT/IB2012/002589—International Search Report with written Opinion—mailing Date Jan. 3, 2014.
PCT International Report on Patentability, PCT/IB2012/002589, international filing date: Nov. 7, 2012, date of issuance: May 12, 2015, all pages.

*Primary Examiner* — Michelle M Koeth

(57) ABSTRACT

A very low intermediate frequency (VLIF) receiver and a method of controlling a VLIF receiver. The method comprises estimating energy levels in first and second signals and detecting interference from a first adjacent channel interferer based upon a difference in energy in the first and second signals. The first signal comprising a first on-channel portion and an adjacent channel portion and the second signal comprises an intermediate frequency translation of the first on-channel portion. The energy levels are estimated for corresponding time instances and the adjacent channel interferer is of the adjacent channel portion. The VLIF receiver is then controlled based upon the detected interference.

6 Claims, 6 Drawing Sheets

(56) References Cited

U.S. PATENT DOCUMENTS

| | | |
|---|---|---|
| 7,043,208 B2 | 5/2006 | Nigra |
| 7,424,278 B2 | 9/2008 | Campbell et al. |
| 7,697,632 B2 | 4/2010 | Khlat et al. |
| 7,697,645 B2 | 4/2010 | Jong |
| 7,804,922 B2 | 9/2010 | Shi et al. |
| 7,822,385 B2 | 10/2010 | Lopez |
| 2005/0095985 A1 | 5/2005 | Hafeoz |
| 2006/0062331 A1* | 3/2006 | Shirazi ............... H03D 3/007 375/326 |
| 2006/0270337 A1* | 11/2006 | Ibrahim ............... H03J 1/0008 455/3.01 |
| 2007/0165748 A1* | 7/2007 | Khlat ............... H03D 3/002 375/322 |
| 2007/0291880 A1* | 12/2007 | Ashkenazi ........... H03G 3/3068 375/345 |
| 2009/0305643 A1 | 12/2009 | Sayers et al. |
| 2010/0105345 A1 | 4/2010 | Thampi et al. |
| 2010/0173601 A1* | 7/2010 | Beamish ............... H03J 7/02 455/326 |
| 2011/0026643 A1 | 2/2011 | Ruelke et al. |
| 2011/0135036 A1 | 6/2011 | Andgart et al. |
| 2011/0244821 A1* | 10/2011 | Dorsey ............... H04B 15/06 455/307 |
| 2012/0129480 A1* | 5/2012 | Ruelke ............... H04B 1/0021 455/296 |
| 2012/0171979 A1* | 7/2012 | Miyano ............... H03F 1/3247 455/253.2 |

\* cited by examiner

VERY LOW INTERMEDIATE FREQUENCY (VLIF) RECEIVER AND A METHOD OF CONTROLLING A VLIF RECEIVER

CROSS-REFERENCE TO RELATED APPLICATIONS

This application claims priority to PCT Application Ser. No. PCT/IB2012/002589, filed Nov. 7, 2012, entitled "A VERY LOW INTERMEDIATE FREQUENCY (VLIF) RECEIVER AND A METHOD OF CONTROLLING A VLIF RECEIVER" the contents of which are incorporated herein by reference.

FIELD OF THE DISCLOSURE

The present disclosure relates generally to data communication and more particularly to controlling a Very Low Intermediate Frequency (VLIF) receiver.

BACKGROUND

Very Low Intermediate Frequency (VLIF) receivers are popular due to their relatively low cost and small size, as well as their ability to operate over a broad range of frequencies. A VLIF receiver combines a received radio frequency (RF) signal with a local oscillator prior to analogue to digital conversion. The local oscillator is set at a frequency close to that of the RF signal, but differing by an offset that is referred to as an intermediate frequency. For example, the intermediate frequency is typically between 3.6 kHz to 5.7 kHz, depending on channel spacing.

The local oscillator thus operates at a frequency either just above or just below the frequency of the RF signal, i.e., on one 'side' of the RF signal. At times, this results in interference from an adjacent channel interferer on the side of the RF signal that the local oscillator is operating.

The RF signal comprises an in-phase component, I, and a quadrature component, Q. Often during down conversion, noise, distortion or imbalance is introduced into, or pronounced in, the I and Q components. I/Q imbalance algorithms exist that attempt to estimate amplitude and phase imbalances in the RF signal and compensate for the imbalances; however, such algorithms work adequately only under certain conditions.

Noise and distortion is not only a problem for signal-to-noise ratios of the RF signal, but also poses a problem for carrier detection algorithms. For example, VLIF receivers can falsely detect a carrier under noisy conditions, e.g., interpret adjacent channel noise as an on-channel signal or falsely un-detect a carrier.

Accordingly, there is a need for a VLIF receiver and a method of controlling a VLIF receiver.

BRIEF DESCRIPTION OF THE FIGURES

The accompanying figures, where like reference numerals refer to identical or functionally similar elements throughout the separate views, together with the detailed description below, are incorporated in and form part of the specification, and serve to further illustrate embodiments of concepts that include the claimed invention, and explain various principles and advantages of those embodiments.

Figure 1:
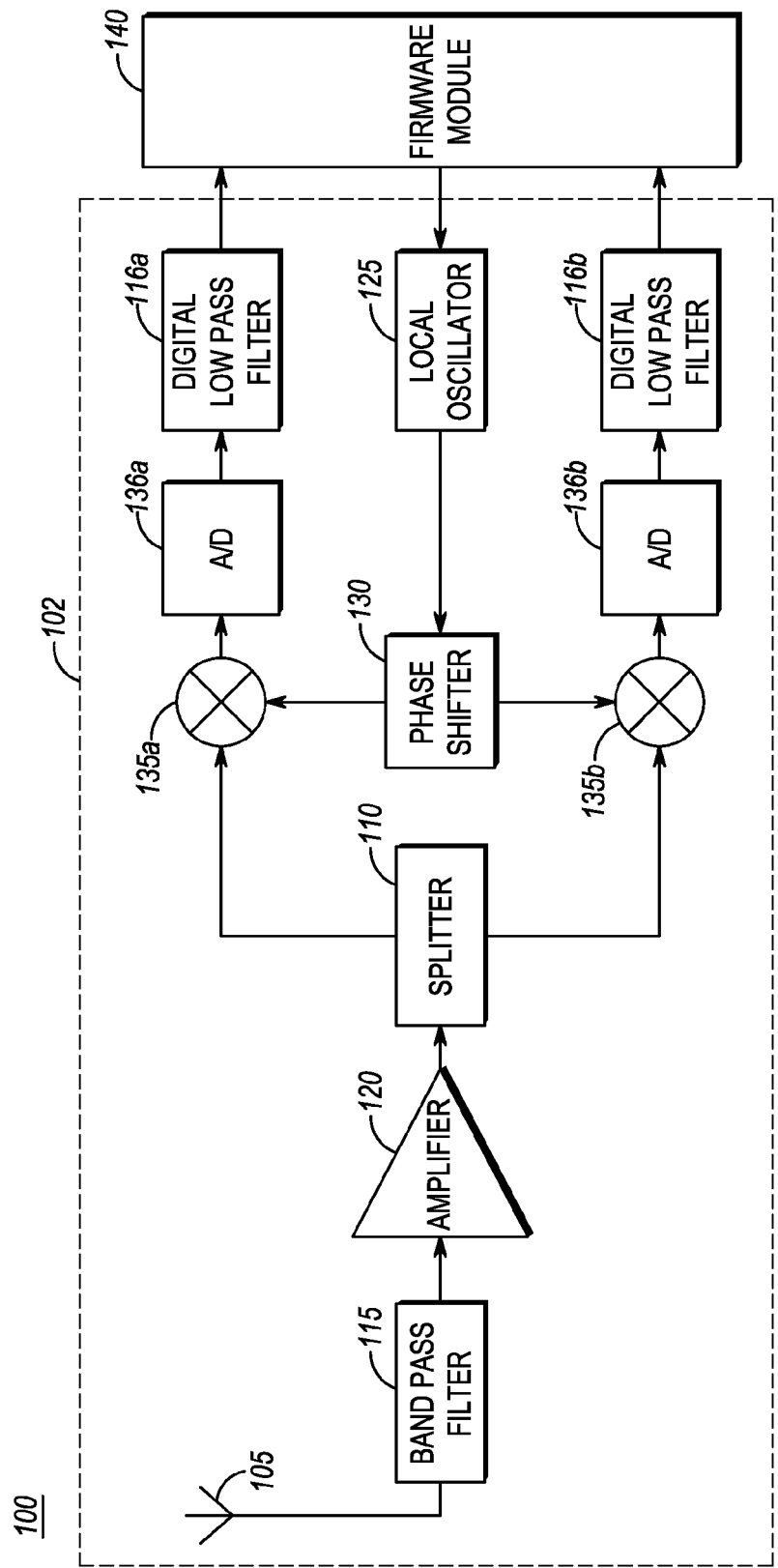
FIG. 1 is block diagram of a Very Low Intermediate Frequency (VLIF) receiver, in accordance with some embodiments.

Skilled artisans will appreciate that elements in the figures are illustrated for simplicity and clarify and have not necessarily been drawn to scale. For example, the dimensions of some of the elements in the figures may be exaggerated relative to other elements to help to improve understanding of embodiments of the present invention.

The apparatus (receiver) and method components have been represented where appropriate by conventional symbols in the drawings, showing only those specific details that are pertinent to understanding the embodiments of the present invention so as not to obscure the disclosure with details that will be readily apparent to those of ordinary skill in the art having the benefit of the description herein.

DETAILED DESCRIPTION

According to certain embodiments of the present invention, a method of controlling a very low intermediate frequency (VLIF) receiver is provided, the method comprising: estimating a first energy level in a first signal, the first signal comprising a first, on-channel portion and an adjacent channel portion; estimating a second energy level in a second signal, wherein the second signal comprises an intermediate frequency translation of the first on-channel portion, wherein the first and second energy levels are estimated for corresponding time instances; detecting interference from a first adjacent channel interferer of the adjacent channel portion based upon a difference in energy between the first energy level and the second energy level; and controlling the VLIF receiver based upon the detected interference.

Advantages of certain embodiments of the present invention include improved adjacent channel selectivity through improved detection and reduction of interference. Improved methods of differentiating between on-channel signals and adjacent channel interferer images are also provided.

Certain embodiments provide improved carrier detection through an improved differentiation between an on-channel signal and IQ imbalance terms of an adjacent channel. Additionally, embodiments of the present invention provide more stable carrier detection.

Other advantages of certain embodiments of the present invention include improved side band suppression which can improve radio performance of a VLIF receiver generally.

FIG. 1 is block diagram of a Very Low intermediate Frequency (VLIF) receiver 100, according to an embodiment of the present invention.

The VLIF receiver 100 includes an antenna 105, for receiving a radio frequency (RF) signal, the antenna 105 coupled to a radio frequency (RF) receiver 102 comprising a splitter 110 coupled to the antenna by a hand pass filter 115 and an amplifier 120. The splitter 110 splits the signal into an in-phase path and a quadrature path, for extracting an in-phase component, I, and a quadrature component, Q, respectively.

The RF receiver 102 further comprises a local oscillator 125, a phase shifter 130, mixers 135a, 135b, analogue to digital converters 136a, 136b, and digital low pass filters 116a, 116b. The I and Q components are extracted using the local oscillator 125. The local, oscillator 125 generates an intermediate frequency signal, which is added to the in-phase and quadrature paths. The intermediate frequency signal is phase shifted 90 degrees by the phase shifter 130 before being added to the quadrature path using a first mixer 135a, and added to the in-phase path without phase shift, i.e., shifted by 0 degrees, by a second mixer 135b. The I and Q components are digitized by analogue to digital converters 136a, 136b and then filtered by digital low pass filters 116a, 116b.

The filtered I and Q components, are then provided to a firmware module 140 for further processing.

According to certain embodiments, the firmware module 140 includes a module for controlling the local oscillator 125 of the VLIF receiver 100. In this case, by controlling the local oscillator 125, the firmware module 140 can reduce interference. This is performed by changing a frequency of the local oscillator 125, such that the changed frequency is on the "other side" of the signal than the noisy interferer.

According to certain embodiments, the ideal oscillator 125 is switchable between a first frequency, which corresponds to a frequency of the desired signal minus a frequency offset, and a second frequency, which corresponds to the frequency of the desired signal plus the frequency offset. This enables the firmware module 140 to efficiently switch between the first and second frequencies to avoid interference from an adjacent interferer on one side of the channel.

The firmware module 140 estimates an energy level of a first, on-channel portion and an adjacent channel portion, estimates another energy level of an intermediate frequency translation of the first on-channel portion, and determines a difference in energy between them. In order to be able to accurately compare the difference in energy levels, both energy levels are estimated for corresponding time instances.

The first energy level corresponds to a wider bandwidth signal, the signal corresponding to the on-channel portion and the adjacent channel portion before intermediate frequency translation. The second energy level corresponds to the on-channel portion after intermediate frequency translation and channel filtering.

By calculating the difference in energy between the first and second energy levels, the VLIF receiver 100 is able to detect an additional energy contribution from the adjacent channel portion on the side that the local oscillator 125 is currently operating. If a threshold is exceeded, it is likely that the adjacent channel portion is providing significant interference on that side, and the firmware module 140 instructs the local oscillator 125 to change frequency such that the local oscillator 125 operates on the other side. Accordingly, the adjacent channel portion will be further from the frequency of the local oscillator 125 and thus provide less interference.

The antenna 105, the splitter 110, the band pass filter 113, the amplifier 120, the local oscillator 125, the phase shifter 130, mixers 135a, 135b, analogue to digital converters 136a, 136b, digital low pass filters 116a, 116b, comprise a hardware module 145 of the VLIF receiver 100.

Figure 2:
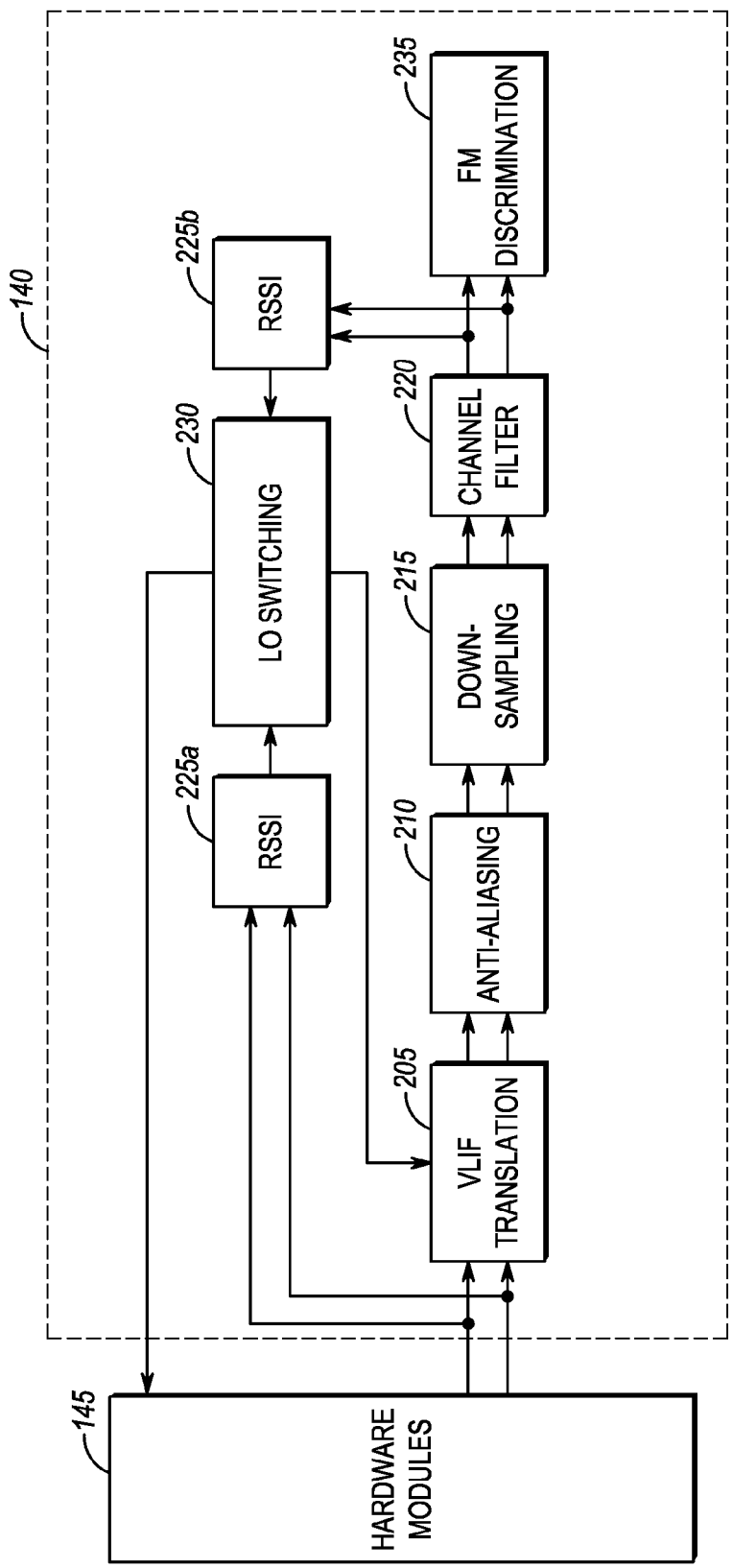
FIG. 2 illustrates a firmware module of the VLIF receiver of FIG. 1, in accordance with some embodiments.

FIG. 2 illustrates a firmware module 140 of the VLIF receiver 100, according to an embodiment of the present invention. The firmware module 140 is coupled to the hardware module 145, as illustrated in FIG. 1.

The firmware module 140 includes a VLIF translation module 205, which receives the filtered I and Q elements from the mixers 135a, 135b and performs VLIF translation on the I and Q elements. The VLIF translated I and Q elements are then input into an anti-aliasing module 210, which performs anti-aliasing, followed by a down-sampling module 215, which performs down-sampling of the signal, and a channel filter 220, which provides a band pass filtration of the signal.

A first energy calculation module 225a calculates a first level of energy in the signal prior to VLIF translation by the VLIF translation module 205 and after filtering by the digital low pass filters 116a, 116b. A second energy calculation module 225b calculates a second level of energy in the I and Q elements of the signal subsequent to VLIF translation, anti-aliasing, down sampling and channel filtering.

The digital low pass filter 116a, 116b are wider filters than the channel filter 220. The digital low pass filter 116a, 116b allows both an on channel signal and an adjacent channel interferer to pass, whereas the channel filler 220 allows only the on channel signal. Accordingly, the first energy calculation module 225a calculates a level of energy corresponding to the on channel signal and the adjacent, channel interferer, whereas the second calculation module 225b calculates a level of energy corresponding to the on channel signal only. For example, the first and second levels of energy can be calculated according to a Received Signal Strength Indication (RSSI).

The first and second levels of energy are provided to a local oscillator switching module 230, which can switch a frequency of the local oscillator 125 based upon, a difference in the first and second levels of energy, as discussed in further detail below.

Finally, the signal from the channel filter 220 is provided to a frequency modulation discrimination module 235 for demodulation of the signal.

According to certain embodiments, the VLIF receiver 100 also includes a Duty Cycle Adjust (DCA) module (not shown). A duty cycle setting of the DCA module is determined where a difference in phase errors at different frequencies or frequency offsets is low. Measurements can be done across several frequencies, such as low, middle and high frequencies of the RF Frequency band, and several positive and negative frequency offsets. The measurements can be performed at time of manufacture.

Phase and amplitude error can then be calculated at the offset where good sideband suppression is required at the DCA setting and stored in memory, as discussed further below. Good sideband suppression is required on the adjacent channel on the side of the intermediate frequency, so that an image generated from the adjacent, channel will be suppressed.

The VLIF receiver 100 is then set to operate at the Duty Cycle Adjust setting, and the VLIF receiver 100 is set to compensate for IQ error at the Duty Cycle Adjust setting using the stored phase and amplitude errors.

Figure 3A:
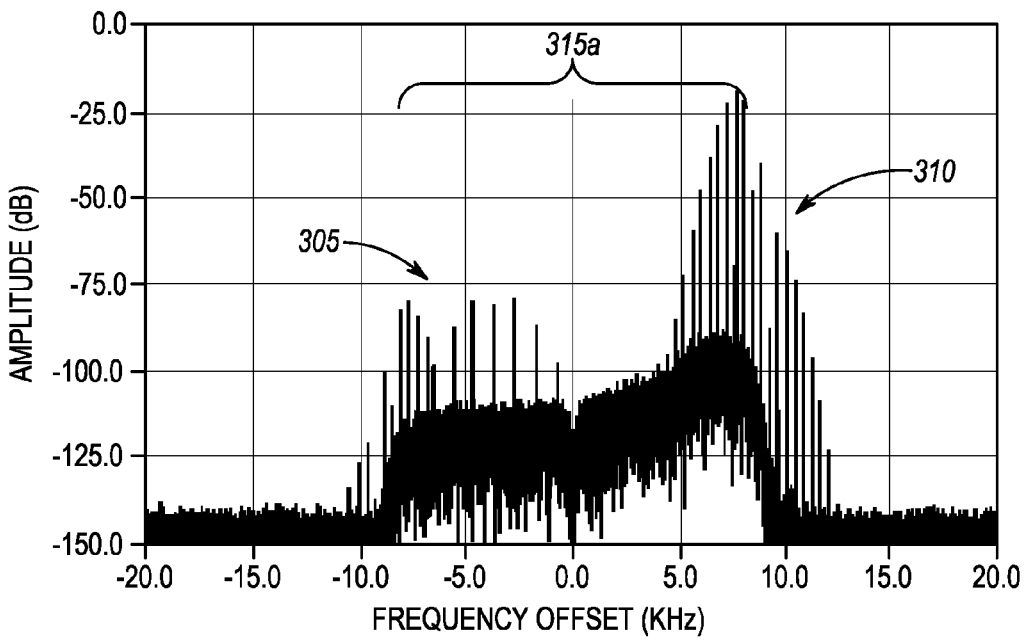
FIG. 3a illustrates a baseband spectrum plot, prior to intermediate frequency translation, in accordance with some embodiments.
Figure 3B:
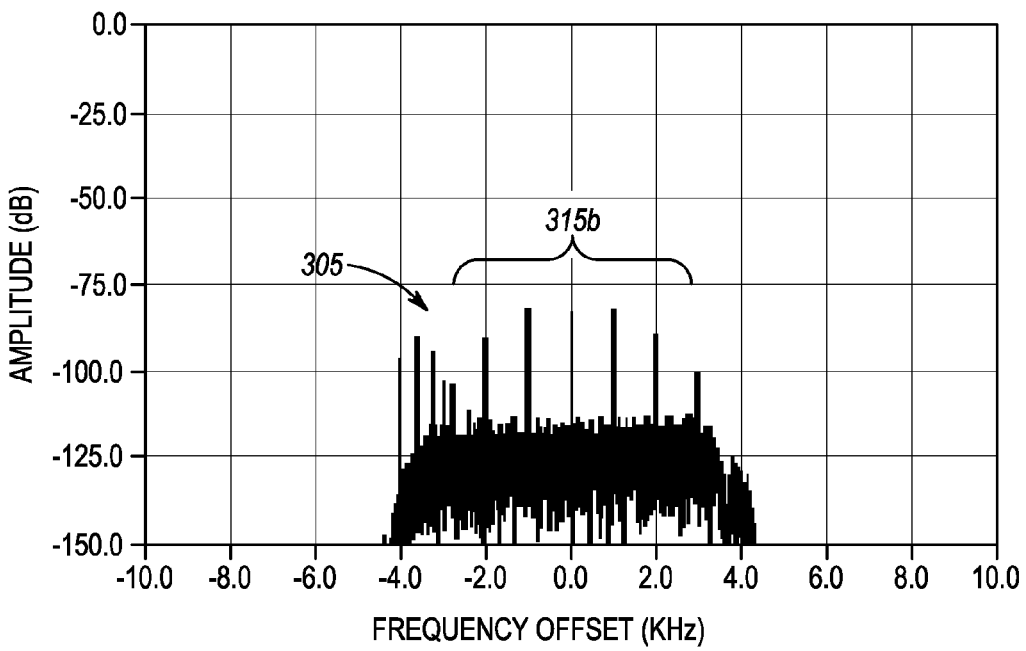
FIG. 3b illustrates another baseband spectrum plot, after intermediate frequency translation, in accordance with some embodiments.

FIG. 3a illustrates a baseband spectrum plot 300a, including both an on-channel signal 305 and a strong adjacent channel interferer 310. The strong adjacent channel interferer 310 is on the positive side of the baseband spectrum plot 300a and is indicated by a plurality of high amplitude peaks. FIG. 3b illustrates a baseband spectrum plot 300b, including the on-channel signal 305, after intermediate frequency translation, filtration and down sampling.

The VLIF receiver 100, and in particular the firmware 140, calculates a first level of energy over a first range 315a, comprising the on-channel signal 305 and a strong adjacent channel interferer 310 prior to intermediate frequency translation. The VLIF receiver 100, and in particular the firmware 140, also calculates a second level of energy over a second, range 315b, comprising the on-channel signal 305 after intermediate frequency translation. Both the first and second levels of energy are calculated for data corresponding to a single time instance, to enable, a representative comparison.

The VLIF receiver 100, and in particular the firmware 140, then, compares the difference between the level of energy in the first and second energy levels, and based on the comparison determines whether an adjacent channel interferer is present, if it is determined that the adjacent channel interferer is present and exceeds a predefined threshold, the firmware module 140 instructs the local oscillator 125 to change frequency such that it operates on the other side, i.e., away from the adjacent channel interferer. In this case, the local oscillator 125 is configured to change frequency such that it operates on the negative side of the on-channel signal 305.

Figure 4:
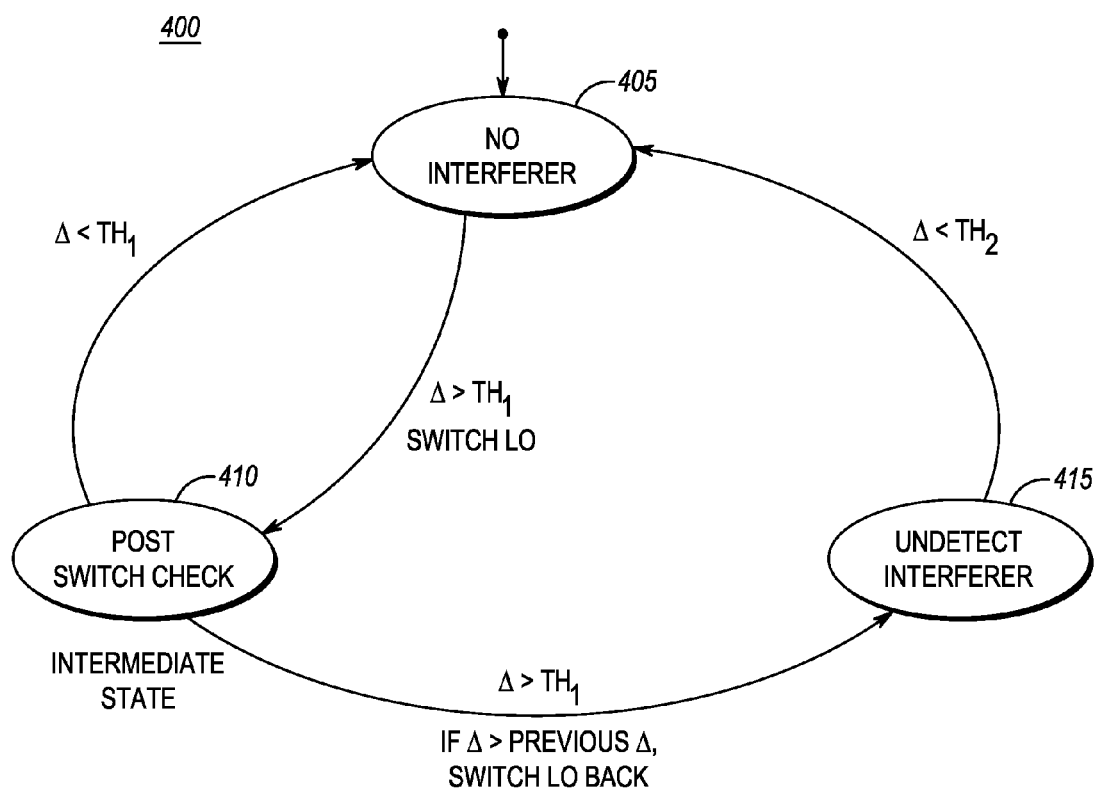
FIG. 4 illustrates a state diagram for local oscillator switching, in accordance with some embodiments.

FIG. 4 illustrates a state diagram 400 for local oscillator switching of the VLIF receiver 100, which switching is controlled by the firmware 140, according to an embodiment of the present invention.

The VLIF receiver 100 continuously determines a difference, $\Delta$, between the energy in the first and second energy levels and moves between states based thereon.

The VLIF receiver 100 is initialized at a no-interferer state 405, while the local oscillator 125 is operating at a first frequency. If the difference $\Delta$ in energy is greater than a first threshold TH1, the local oscillator is switched to a second frequency and the VLIF receiver 100 is moved to a post switch check state 410.

At the post switch check state 410 and while the local oscillator 125 is operating at the second frequency, the difference $\Delta$ between the energy in the first and second energy levels is again, determined, if the difference $\Delta$ is less than the first threshold TH1, the VLIF receiver 100 is moved back to the no-interferer state 405.

If, on the other hand, the difference $\Delta$ is greater than the previous difference $\Delta$, such that the difference after switching is greater than the difference before switching, the local oscillator 125 is switched back to the first frequency and the VLIF receiver 100 is moved to an undetect interferer state 415.

At the undetect interferer state 415, the difference $\Delta$ between the energy in the first and second levels of energy is again determined, if the difference $\Delta$ is less than a second threshold TH2, the VLIF receiver 100 is moved back to the no-interferer state 405. The second threshold TH2 is advantageously lower than the first threshold TH1, thus making it more difficult for the VLIF receiver 100 to move back to the no-interferer state 405 from the undetect interferer state 415 than from the post switch check, state 410. This is to prevent constant switching when interference is detected on both, sides of the signal.

Figure 5:
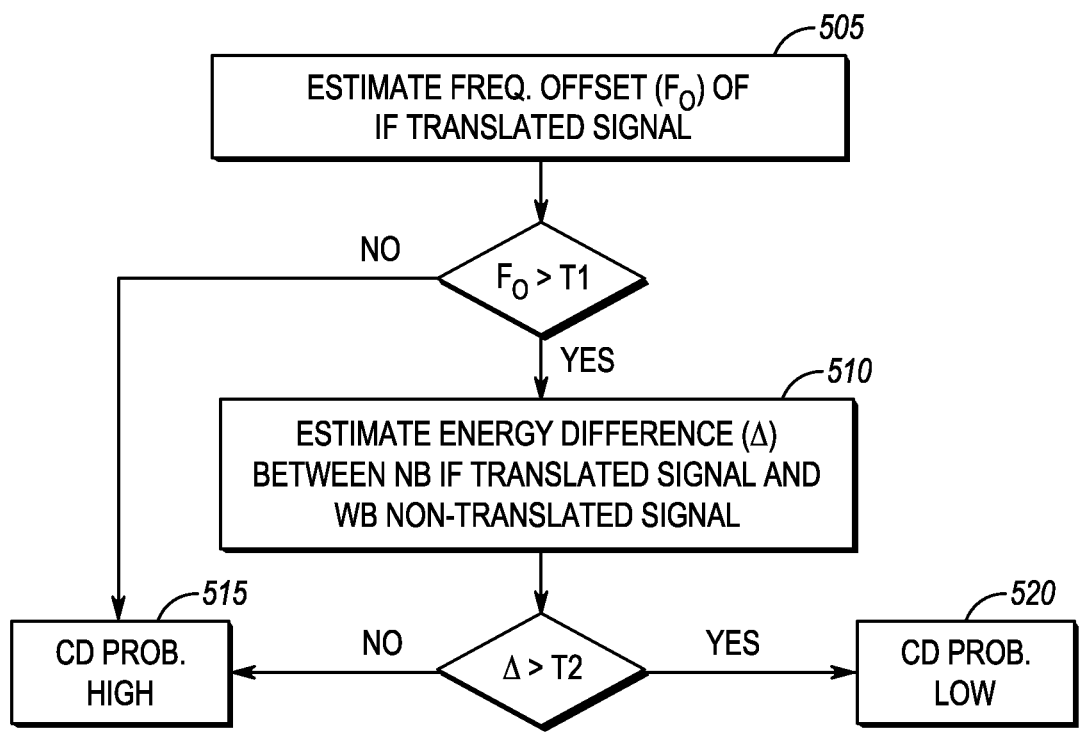
FIG. 5 illustrates a method of estimating a probability of a presence of a carrier in a signal, in accordance with some embodiments.

FIG. 5 illustrates a method 500 of estimating, by a carrier detection module (not shown) implemented by the firmware 140, a probability of a presence of a carrier in a signal, according to an embodiment of the present invention. The VLIF receiver 100 is set to operate at a frequency offset (fo) fulfilling the following condition:

$$fo < FBW/2 - fa_{offint}$$

where FBW is a channel spacing corresponding to the received signals and fa$_{offint}$ is the maximum relative frequency offset of interfering radios.

In 505, a frequency offset of an intermediate frequency translated signal is estimated. When a desired received signal of a VLIF receiver 100 is translated to baseband, it can be shown that the frequency offset, will not exceed fa$_{offOn}$, the maximum relative frequency offset of the on channel signal. On the other hand, the IQ imbalance terms will have frequency offset exceeding FBW−2fo−fa$_{offint}$. Accordingly, this information can be used to differentiate whether a received signal is an interferer or not.

This is done by measuring zero frequency, also known as Direct Current (DC), terms of a discriminator output of the VLIF receiver 100, which is proportional to the frequency offset of the received signal, if the estimated frequency offset is high, e.g., greater than a predefined threshold, the received signal is considered to include a potential interferer. The threshold is advantageously set based on the following guideline, based on the reasoning discussed earlier:

$$fa_{offOn} < fth < FBW - 2fo - fa_{offint}$$

If the frequency offset is high, an energy difference between the narrow band, intermediate frequency translated signal and the wideband non-translated signal is estimated, in 510. Otherwise the carrier detection probability is marked as high directly in 515.

In 510, an energy level of an on-channel portion and an adjacent channel portion, that is a wideband non-intermediate frequency translated signal, is estimated, an energy level in an intermediate frequency translation of the on-channel portion is estimated, and a difference in energy between these energy levels is estimated. This process can be similar or identical to the energy difference estimation described above with reference to FIGS. 1 to 3.

If the estimated energy difference is high, the carrier detection probability is marked as low in 520. In this case, it is estimated that an adjacent channel interferer only is present, if the estimated energy difference is low, the carrier detection probability is marked as high in 515. In this case, it is estimated that both an adjacent channel interferer and an on channel signal is present.

In the above example, carrier detection probabilities are simply marked as high or low. However, according to alternative embodiments, earner detection probabilities can have any suitable granularity. For example, based upon both the estimated frequency offset of 505 and the estimated energy difference of 510, a carrier detection probability can be determined. In this case, the estimated frequency offset and the estimated energy difference can be factors used when estimating the probability, potentially together with other factors.

White the method 500 can be used to detect presence of a carrier directly, it has been found to be advantageous to delay certain decisions. According to certain embodiments, the method 500 is used to calculate a raw carrier detection value, which is processed prior to actual carrier detection.

If it is determined that, a carrier probability is low, a delay is added to any carrier detect or carrier un-detect decision. This is because an interferer is present which may incorrectly influence the raw carrier detection value. Thus, by delaying the decision in this case, a more stable carrier detection value is obtained, which can avoid toggling between states.

Similarly, carrier detect and un-detect decisions can be delayed, essentially low pass filtering the raw carrier detection, so that decisions are made based upon a larger amount of data. This prevents temporary outliers in the raw carrier detection data from creating a carrier detect or carrier un-detect state incorrectly.

Figure 6:
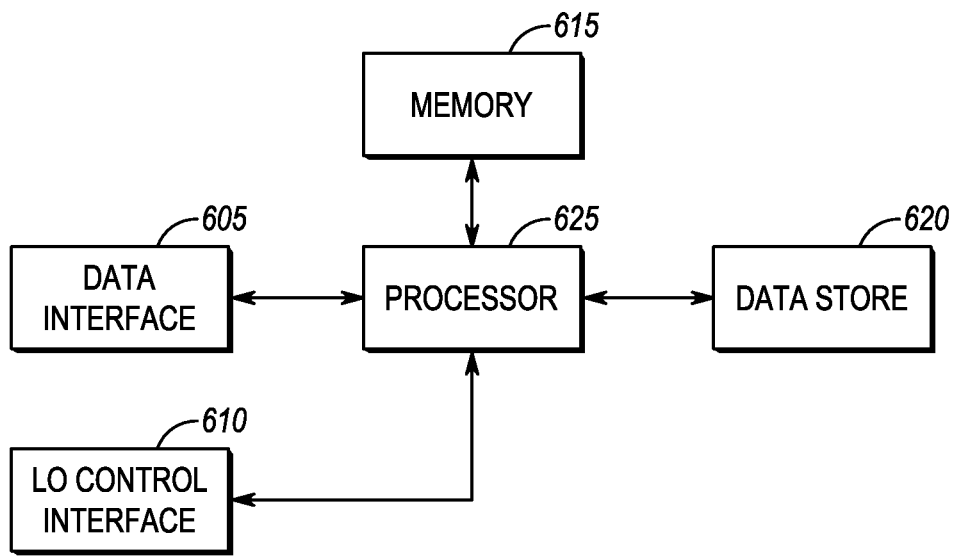
FIG. 6 illustrates a processing module, in accordance with some embodiments.

FIG. 6 illustrates a processing module 600, according to an embodiment of the present invention. The processing module 600 can be part of the VLIF receiver 100, can control the firmware module 140, or be used to implement the methods described above.

The processing module 600 includes a data interlace 605, a local oscillator control interface 610, a memory 615, a data store 620, and a processor 625 coupled to the data interface 605, local oscillator control interlace 610, memory 615, and data store 620.

The data interface 605 provides an interface to the in-phase (I) and quadrature (Q) signals of the VLIF receiver 100. The data interface 605 can include an analogue-to-digital converter, for sampling analogue I and Q signals digitally. The processor 625 is then able to process the digital I and Q signals, and can, for example, apply I/Q imbalance correction.

The LO control interface 610 provides an interface to the local oscillator of the VLIF receiver 100. The LO control interface 610 can, for example, comprise a voltage output, which when provided to the local oscillator 125 determines a frequency at which the local oscillator 125 will operate.

The processor 625 processes computer readable program code components stored in the memory 615 and implements various methods and functions of the VLIF receiver 100 as described herein, such as switching of local oscillator frequency based upon detected interference, carrier detection functions, and signal filtration. For example, the processor 625 comprises firmware module 140, which firmware module implements the Duty Cycle Adjust (DCA) module (not shown) that adjusts a duty cycle as described above and the carrier detection module (not shown) that detects an on-channel signal as described above, based on computer readable program code components stored in the memory 615.

The data store 620 includes data, such as thresholds, filter tap data, or any other persistent data. Similarly, phase and amplitude errors at the offset where good sideband suppression is required and at the DCA setting are stored in memory 615 or data store 620. As will be understood by a person skilled in the art, a single memory, such as the memory 615, can be used to store both dynamic and static data.

The processing module 600 can include a system bus (not shown) that couples various system components, including coupling the memory 615 to the processor 625. The system bus can be any of several types of bus structures including a memory bus or memory controller, a peripheral bus, and a local bus using any of a variety of bus architectures.

The processor 625 and memory 615 can be replaced by dedicated hardware, and the processing module 600 can include software, hardware, firmware, or any combination thereof.

The structure of system memory 615 is well known to those skilled in the art and can include a basic input/output system (BIOS) stored in a read only memory (ROM) and one or more program modules such as operating systems, application programs and program data stored in random access memory (RAM).

In the foregoing specification., specific embodiments have been described. However, one of ordinary skill in the art appreciates that various modifications and changes can be made without departing from the scope of the invention as set forth in the claims below. Accordingly, the specification and figures are to be regarded in an illustrative rather than a restrictive sense, and all such modifications are intended to be included within the scope of present teachings.

The benefits, advantages, solutions to problems, and any elements) that may cause any benefit, advantage, or solution to occur or become more pronounced are not to be construed as a critical, required, or essential features or elements of any or all the claims. The invention is defined solely by the appended claims including any amendments made during the pendency of this application and all equivalents of those claims as issued.

Moreover in this document, relational terms such as first and second, top and bottom, and the like may be used solely to distinguish one entity or action from another entity or action without necessarily requiring or implying any actual such relationship or order between such entities or actions. The terms "comprises," "comprising," "has", "having," "includes", "including", "contains", "containing" or any other variation thereof, are intended to cover a non-exclusive inclusion, such that a process, method, article, or apparatus that comprises, has, includes, contains a list of elements does not include only those elements but may include other elements not expressly listed or inherent to such process, method, article, or apparatus. An element proceeded by "comprises . . . a", "has . . . a", "includes . . . a", "contains . . . a" does not, without more constraints, preclude the existence of additional identical elements in the process, method, article, or apparatus that comprises, has, includes, contains the element. The terms "a" and "an" are defined as one or more unless explicitly stated otherwise herein. The terms "substantially", "essentially", "approximately", "about" or any other version thereof, are defined as being close to as understood by one of ordinary skill in the art, and in one non-limiting embodiment the term is defined to be within 10%, in another embodiment within 5%, in another embodiment within 1% and in another embodiment within 0.5%. The term "coupled" as used herein is defined as connected, although not necessarily directly and not necessarily mechanically. A device or structure that is "configured" in a certain way is configured in at least that way, but may also be configured in ways that are not listed.

It will be appreciated that some embodiments may be comprised of one or more generic or specialized processors (or "processing devices") such as microprocessors, digital signal processors, customized processors and field programmable gate arrays (FPGAs) and unique stored program instructions (including both software and firmware) that control the one or more processors to implement, in conjunction with certain non-processor circuits, some, most, or all of the functions of the method and/or apparatus described herein. Alternatively, some or all functions could be implemented by a state machine that has no stored program instructions, or in one or more application specific integrated circuits (ASICs), in which each function or some combinations of certain of the functions are implemented as custom logic. Of course, a combination of the two approaches could be used.

Moreover, an embodiment can be implemented as a computer-readable storage medium having computer readable code stored thereon for programming a computer (e.g., comprising a processor) to perform a method as described and claimed herein. Examples of such computer-readable storage mediums include, but are not limited to, a hard disk, a CD-ROM, an optical storage device, a magnetic storage device, a ROM (Read Only Memory), a PROM (Programmable Read Only Memory), an EPROM (Erasable Programmable Read Only Memory), an EEPROM (Electrically Erasable Programmable Read Only Memory) and a Flash memory. Further, it is expected that one of ordinary skill, notwithstanding possibly significant effort and many design choices motivated by, for example, available time, current technology, and economic considerations, when guided by the concepts and principles disclosed herein will be readily capable of generating such software instructions and programs and ICs with minimal experimentation.

The Abstract of the Disclosure is provided to allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in various embodiments for the purpose of streamlining the disclosure. This method of disclosure is not to be interpreted as reflecting an intention that the claimed, embodiments require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separately claimed subject matter.

We claim:

1. A method of controlling a very low intermediate frequency (VLIF) receiver, the method comprising:
   estimating a first energy level in a first signal, the first signal comprising a first on-channel portion and an adjacent channel portion;
   estimating a second energy level in a second signal, wherein the second signal comprises an intermediate frequency translation of the first on-channel portion, wherein the first and second energy levels are estimated for corresponding time instances;
   detecting interference from a first adjacent channel interferer of the adjacent channel portion on only one side of the first on-channel portion, based upon a difference in energy between the first energy level and the second energy level; and
   controlling the VLIF receiver based upon the detected interference by:
   detecting a carrier in the first on-channel portion using the detected interference;
   estimating a frequency offset of the second signal;
   detecting an on-channel signal in the first on-channel portion using the frequency offset by:
      determining, via a carrier detection module, the on-channel signal based at least partly upon:
         a) the frequency offset being lower than a frequency offset threshold, or
         b) the frequency offset being greater than the frequency offset threshold, and the detected interference; and
   wherein the frequency offset threshold is greater than faoffOn and less than FBW−2fo−faoffInt, wherein FBW is a channel spacing, fo is an offset of a local oscillator of the VLIF receiver, faoffInt is a maximum relative frequency offset of the first adjacent channel interferer and faoffOn is a maximum relative frequency offset of the on-channel signal.

2. The method of claim 1, wherein upon determining that the frequency offset is greater than the frequency offset threshold, a decision to determine presence or absence of the on-channel signal is delayed.

3. A method of controlling a very low intermediate frequency (VLIF) receiver, the method comprising:
   estimating a first energy level in a first signal, the first signal comprising a first on-channel portion and an adjacent channel portion;
   estimating a second energy level in a second signal, wherein the second signal comprises an intermediate frequency translation of the first on-channel portion, wherein the first and second energy levels are estimated for corresponding time instances;
   detecting interference from a first adjacent channel interferer of the adjacent channel portion on only one side of the first on-channel portion, based upon a difference in energy between the first energy level and the second energy level; and
   controlling the VLIF receiver based upon the detected interference, the VLIF receiver comprising a local oscillator switchable between at least two frequencies, wherein controlling the VLIF receiver comprises switching the local oscillator from a first frequency of the at least two frequencies to a second frequency of the at least two frequencies, wherein the at least two frequencies comprise a first oscillator frequency with a negative offset relative to the first on-channel portion and a second oscillator frequency with a positive offset relative to the first on-channel portion; and
   wherein an absolute value of the positive and negative offsets is less than FBW/2−faoffInt, where FBW is a channel spacing corresponding to a channel on which the first signal is transmitted, and faoffInt is a maximum relative frequency offset of the first adjacent channel interferer.

4. The method of claim 3, further comprising:
   subsequent to switching the local oscillator to the second frequency:
   estimating a third energy level in a third signal, the third signal comprising the first on-channel portion and a second adjacent channel portion;
   estimating a fourth energy level in a fourth signal, the fourth signal comprising an intermediate frequency translation of the first on-channel portion, wherein the third and fourth energy levels are estimated for corresponding time instances;
   detecting interference from a second adjacent channel interferer of the second adjacent channel portion based upon a difference in energy between the third energy level and the fourth energy level;
   in response to detecting interference from the second adjacent channel interferer, determining whether the interference from the second adjacent channel interferer is greater than the interference from the first adjacent channel interferer; and switching the local oscillator back to the first frequency based on the determination.

5. The method of claim 3, wherein detecting interference from the adjacent channel interferer comprises detecting that a difference in energy between the first energy level and the second energy level is greater than a predefined threshold.

6. The method of claim 3, further comprising:
   measuring phase errors across different frequencies or frequency offsets;
   determining a Duty Cycle Adjust setting of the VLIF receiver, by calculating a difference between phase errors at the different frequencies or frequency offsets, wherein the Duty Cycle Adjust setting of the VLIF receiver is determined where a difference between phase errors at the different frequencies or frequency offsets is low;

setting the VLIF receiver to the Duty Cycle Adjust setting; and compensating for IQ error when the VLIF receiver is configured to operate at the Duty Cycle Adjust setting using the difference between calculated phase errors.

* * * * *